United States Patent
Brod et al.

(10) Patent No.: US 11,107,943 B2
(45) Date of Patent: Aug. 31, 2021

(54) METHOD AND DEVICE FOR TRANSPORTING AN ARRANGEMENT OF FLEXIBLE CIRCUIT SUBSTRATES DURING THE PRODUCTION OF A LAMINATE THEREFROM

(71) Applicant: MUHLBAUER GMBH & CO. KG, Roding (DE)

(72) Inventors: Volker Brod, Bad Abbach (DE); Klaus Schlemper, Dresden (DE); Dieter Bergmann, Dresden (DE)

(73) Assignee: MÜHLBAUER GMBH & CO. KG, Roding (DE)

( * ) Notice: Subject to any disclaimer, the term of this patent is extended or adjusted under 35 U.S.C. 154(b) by 345 days.

(21) Appl. No.: 16/356,876

(22) Filed: Mar. 18, 2019

(65) Prior Publication Data
US 2019/0296179 A1    Sep. 26, 2019

(30) Foreign Application Priority Data
Mar. 20, 2018   (DE) .......................... 102018106544.2

(51) Int. Cl.
*H01L 21/00*    (2006.01)
*H01L 31/00*    (2006.01)
(Continued)

(52) U.S. Cl.
CPC ...... *H01L 31/188* (2013.01); *H01L 21/67132* (2013.01); *H01L 21/67706* (2013.01);
(Continued)

(58) Field of Classification Search
CPC ......... H01L 21/00; H01L 21/60; H01L 21/67; H01L 21/671; H01L 21/6713;
(Continued)

(56) References Cited

U.S. PATENT DOCUMENTS 6,367,530 B1 * 4/2002 Shimotomai .......... B29C 43/56
156/382

FOREIGN PATENT DOCUMENTS

| DE | 102013010447 | 12/2014 |
| DE | 202015002724 | 5/2015 |
| WO | WO 2011/131346 | 10/2011 |

OTHER PUBLICATIONS

Official Action for German Patent Application No. 102018106544.2, dated Nov. 27, 2018, 7 pages.

* cited by examiner

*Primary Examiner* — Jacob T Minskey
*Assistant Examiner* — Matthew Hoover
(74) *Attorney, Agent, or Firm* — Sheridan Ross P.C.

(57) ABSTRACT

The invention relates to a method and a device for transporting an arrangement of flexible circuit substrates produced on a transport substrate during the production of a laminate from the arranged circuit substrates, as well as—building thereon—a method and a device for producing a laminate of flexible circuit substrates. In the method, a film is applied to the arranged circuit substrates on the side thereof opposite the transport substrate, with the result that the film comes to lie over the transport substrate in at least two sections that are separate from each other and are not covered by a circuit substrate, and runs between them continuously over at least one of the circuit substrates. Then, the arranged circuit substrates are fixed on the transport substrate by means of the generation of a negative pressure acting on the arrangement of the circuit substrates, and which, at least in sections, directly impinges on the arrangement of the circuit substrates itself as well as, at least in sections, additionally on the film (6) and thereby in turn indirectly on at least one of the circuit substrates in the direction of the transport substrate with a pressing force with (Continued)

respect to the transport substrate. Then, the arrangement of circuit substrates fixed on the transport substrate by means of the pressing force is transported by moving the transport substrate. In the production method, the transport method is used for transporting the arrangement between individual manufacturing steps. The devices according to the invention are correspondingly arranged to carry out the above-mentioned method.

19 Claims, 3 Drawing Sheets

(51) Int. Cl.
*H01L 31/18* (2006.01)
*H01L 21/677* (2006.01)
*H01L 31/02* (2006.01)
*H01L 21/683* (2006.01)
*H01L 21/67* (2006.01)

(52) U.S. Cl.
CPC .... *H01L 21/67721* (2013.01); *H01L 21/6838* (2013.01); *H01L 31/02* (2013.01); *H01L 31/18* (2013.01); *H01L 31/1876* (2013.01)

(58) Field of Classification Search
CPC ............. H01L 21/67132; H01L 21/677; H01L 21/677; H01L 21/67706; H01L 21/6772; H01L 21/67721; H01L 21/68; H01L 21/683; H01L 21/6838; H01L 31/00; H01L 31/02; H01L 31/10; H01L 31/18; H01L 31/187; H01L 31/1876; H01L 31/188
See application file for complete search history.

METHOD AND DEVICE FOR TRANSPORTING AN ARRANGEMENT OF FLEXIBLE CIRCUIT SUBSTRATES DURING THE PRODUCTION OF A LAMINATE THEREFROM

CROSS-REFERENCE TO RELATED APPLICATION

This application claims the benefit of German Patent Application No. 10 2018 106 544.2 filed Mar. 20, 2018, the entire contents of which are incorporation herein by reference.

FIELD

The present invention relates to a method and a device for transporting an arrangement of flexible circuit substrates positioned on a transport substrate, in particular an arrangement of flexible solar cells, during the production of a laminate from the arranged circuit substrates, as well as— building thereon—a method and a device for producing a laminate of flexible circuit substrates, in particular a laminate of flexible solar cells.

BACKGROUND

In addition to rigid circuit substrates, such as conventional printed circuit boards (PCBs) and semiconductor circuits, in particular conventional integrated circuits, flexible circuit substrates, such as flexible semiconductor circuit substrates or multi-layered thin-layer substrates are known for a range of different applications, including also solar technology.

By a "flexible circuit substrate" is meant, within the meaning of the invention, a substrate which bears an electrical, in particular electronic circuit with at least one component, wherein the substrate including the circuit can be bent, in particular by more than 45 degrees, or even rolled up non-destructively and reversibly. In particular, flexible circuit substrates also include arrangements which are in each case formed as a laminate of flexible circuit substrates. This applies in particular to flexible solar cell modules (which are often also called thin-film solar modules), which are composed of a plurality of flexible solar cells in the framework of a fixed laminate.

In the production of such a laminate from flexible circuit substrates, these are typically first of all positioned, initially as separate units, on a surface in a usually regular, often grid-shaped, in particular often matrix-type, arrangement in order then to further process the thus-formed arrangement in further manufacturing steps to form a fixed laminate. This processing is often effected along a production flow or a production line with various processing stations, with the result that the arrangement of the flexible circuit substrates has to be transported between at least two different processing stations before the laminate, in which the individual circuit substrates are then fixed relative to each other, is finished. In many applications, when such a laminate is produced not only a mechanical connection but at the same time an electrical connection is to be produced between in each case adjacent individual circuit substrates. With regard to both, in particular however with regard to a correct electrical connection, a high degree of precision of the relative positioning of the individual circuit substrates with respect to each other in the finished laminate is desirable, above all also in order to be able to achieve a sufficiently high yield in the production. It is therefore necessary, so far as possible to minimize or ideally to prevent entirely changes in the original arrangement, which could result during transport of the arrangement between the different processing stations.

However, this is often made more difficult by the fact that the individual flexible circuit substrates have undesired deformations, in particular deflections, because of their flexibility. These can be caused, for example, by properties of a layer structure of the circuit substrates, for instance when one side of the circuit substrate is coated, for example with a printed circuit, and its opposite side is not or is coated differently, with the result that, in particular depending on the temperature, mechanical stresses can form in the circuit substrate. Such deformation effects occur regularly in particular in the case of flexible solar cells.

SUMMARY

The object of the present invention is to further improve the transport of the circuit substrates during a production process for producing a laminate from flexible circuit substrates and thus also such a production itself.

This object is achieved according to the teaching of the independent claims. Various embodiments and further developments of the invention are the subject of the dependent claims.

A first aspect of the invention relates to a method (in the following also called "transport method") for transporting an arrangement of flexible circuit substrates positioned on a first side of a transport substrate, in particular an arrangement of flexible solar cells, during the production of a laminate from the arranged circuit substrates, in particular between two processing steps in the production of the laminate. The method comprises the following steps: (i) applying a, preferably airtight, film to the arranged circuit substrates on the side thereof opposite the transport substrate, with the result that the film comes to lie over the transport substrate in at least two sections that are separate from each other and are not covered by a circuit substrate, and runs between these continuously over at least one of the circuit substrates, in particular without forming a fixed connection to the circuit substrate; (ii) fixing the arranged circuit substrates on the transport substrate by means of the generation of a negative pressure acting on the arrangement of the circuit substrates, and which, at least in sections, directly impinges on the arrangement of the circuit substrates itself as well as, at least in sections, additionally on the film and thereby in turn indirectly on at least one of the circuit substrates in the direction of the transport substrate with a pressing force with respect to the transport substrate; and (iii) transporting the arrangement of circuit substrates fixed on the transport substrate by means of the pressing force by moving the transport substrate.

With the aid of this transport method, the arrangement of circuit substrates positioned on the transport substrate can be effectively fixed during transport thereof between different production steps for producing a fixed laminate formed from the circuit substrates, as well as optionally also additionally during one or more of these production steps. This fixing is effected on the one hand by the negative pressure acting directly on the side of the circuit substrates facing the transport substrate, and on the other hand additionally, and indirectly, by the film that is applied on the side of the circuit substrates facing away from the transport substrate and is pressed onto at least one of the circuit substrates in the direction of the transport substrate by means of the negative pressure, which film spans at least that circuit substrate and, at least on both or two sides of this spanning area, is pulled in the direction of the transport substrate by the negative pressure. Ideally, all of the circuit substrates are fixed by the film in this way.

All in all, the fixing is thus strengthened in a simple, less time-consuming, cost-effective and reversible manner without impairing the circuit substrates, with the result that undesired displacements of the circuit substrates with respect to their position on the transport substrate and their position relative to each other can be effectively counteracted, in particular to the point of the at least substantially complete prevention of such undesired displacements.

A second aspect of the invention relates to a method (in the following also called "production method"), building on the above-mentioned transport method according to the first aspect, for producing a laminate of flexible circuit substrates, in particular a laminate of flexible solar cells. The method comprises the following steps: (i) arranging a plurality of flexible circuit substrates to be converted into a joint laminate on a transport substrate by means of a loading device with the result that each of the circuit substrates overlaps with at least one further circuit substrate to form an in particular mechanical and/or electrical connection, in particular such that mutually corresponding electrical contacts on the overlapping circuit substrates come into alignment; (ii) transporting the arrangement of circuit substrates from the loading device to a laminate production device, wherein the arrangement is transported at least in sections by means of the transport substrate utilizing the method according to the first aspect; (iii) forming one or more fixed connections between at least two of the circuit substrates fixed on the transport substrate by means of the laminate production device to form a laminate formed from these circuit substrates.

With the aid of this production method according to the second aspect, a fixed laminate of flexible circuit substrates can be manufactured, which is characterized in particular in that the individual circuit substrates are aligned very precisely relative to each other, whereby a high manufacturing yield can correspondingly also be achieved. This is achieved in that the production method extends from the production or positioning of the arrangement of the circuit substrates on the transport substrate to the formation of the fixed laminate of the individual circuit substrates with the formation of fixed connections between them, and the transport of the arrangement between these manufacturing steps, necessary during the manufacturing process, is effected at least in sections, preferably continuously, with the aid of the transport method already described in relation to the first aspect of the present invention. In this way, undesired absolute or relative displacements of the individual circuit substrates during the manufacturing process can be at least largely prevented, whereby, despite the transport necessary during the manufacturing process, the desired precision can be achieved in the alignment of the circuit substrates within the fixed laminate produced.

In the following, preferred embodiments of the above-mentioned method are described, which, where this is not explicitly ruled out or technically impossible, can in each case be combined with each other as desired and with the other aspects of the invention described below, and can be used in conjunction with each of the methods.

In some embodiments, the film is applied on the arranged circuit substrates such that, in at least one section, it projects laterally beyond an outer envelope curve of the arrangement of the circuit substrates with respect to a direction running parallel to the first side of the transport substrate and is impinged on there by means of the negative pressure with a pressing force with respect to the transport substrate. In this way it can be achieved that the pressing force exerted by the film on the arrangement of the circuit substrates in particular also extends over an edge of the arrangement, and thus protects it against undesired displacements or deformations. In particular, the dimensions of the film and its application can preferably be such that it extends in the lateral direction beyond the envelope curve of the arrangement of the circuit substrates on all sides, with the result that the arrangement as a whole and in particular also its edges are protected on all sides with respect to undesired displacements and deformations by the fixing brought about by means of the film.

In some embodiments, the flexible circuit substrates are arranged on the transport substrate in a regular shingled structure before the application of the film. In this way, the laminate can be designed particularly space-efficiently because of the regular arrangement, wherein, within the framework of the production method according to the second aspect, at the points at which they overlap according to the shingled structure, the adjacent circuit substrates can be connected to each other mechanically and/or electrically to form the fixed laminate. By a "shingled structure" is meant within the meaning of the invention an arrangement of the circuit substrates in which the circuit substrates: (i) are arranged regularly, preferably in the shape of a grid, (ii) have at least substantially the same orientation; and (iii) and each of the circuit substrates has an overlapping area with at least one of its adjacent circuit substrates in the arrangement.

In some embodiments, the flexible circuit substrates are arranged on the transport substrate before the application of the film such that, between at least two of the arranged circuit substrates, a gap forms which is not covered by another of the circuit substrates and which lies completely within the outer envelope curve of the arrangement of the circuit substrates with respect to a direction running parallel to the first side of the transport substrate. In this way, one or more gaps are produced in the arrangement of the circuit substrates, at which the film subsequently applied on the arrangement is pulled in the direction of the carrier substrate under the action of the negative pressure, and preferably also comes into direct contact with it and is pressed against it. A further strengthening of the fixing action of the film can thereby be achieved, in particular also within the area spanned by the envelope curve.

In some embodiments, the arrangement of the flexible circuit substrates on the transport substrate before the application of the film further comprises an introduction of at least one connecting element provided in addition to the circuit substrates for producing a mechanical and/or electrical connection between at least two of the arranged circuit substrates. The connecting elements can in particular serve for the electrical connection in parallel or in series of the individual circuit substrates, such as for example in the case of photovoltaic circuit substrates for the interconnection of solar cells or of submodules made up of several solar cells, of a solar module to be manufactured as a laminate. A mechanical strengthening or stabilization of the laminate can also be achieved in this way.

In some embodiments, the respective method comprises a temporal or spatial variation of the negative pressure along the direction of movement of the transport substrate for producing a correspondingly spatially and/or temporally variable pressing force acting on the arrangement of the circuit substrates with respect to the transport substrate. In this way, the pressing force and thus the fixing brought about by it can be variably adapted to the respective requirements during the transport of the arrangement along a transport path and/or during particular manufacturing steps carried out in the process or inbetween. Thus, for instance, the fixing can be increased during the transport and, in contrast, reduced during a curing process which is based solely on heating and which is thus vibration-free, in particular in order to thus save energy.

In some embodiments of the production method, the latter further comprises the removal of the film from the arranged circuit substrates after or during the formation of at least one of the one or more fixed connections. In this way, the film represents only a process agent for the manufacture of the laminate from circuit substrates, without itself permanently becoming part thereof. The production method can thus also be used for the manufacture of laminates from circuit substrates in which no film is to remain on the circuit substrates in the finished laminate. The film is preferably removed after the negative pressure has been reduced or switched off. Reducing or switching off the negative pressure during the removal of the film makes this easier and can, in particular, contribute to ensuring or further increasing the controllability of the process for removing the film, since the adhesion of the film on the arrangement brought about during the fixing by the negative pressure is reduced or removed. Thus, an uncontrolled, in particular only local, detachment of the film from the arrangement can be reduced or prevented.

In some embodiments building on this, the production method is carried out repeatedly, in particular for producing a plurality of laminates from circuit substrates, and the film removed from the arranged circuit substrates in a previous method run is reused according to the method in a subsequent iteration of the method as film for fixing the circuit substrates. In this way, the process efficiency of the production method with respect to the material usage can be further increased, in that the film is used multiple times and thus the need for new films can be reduced or even prevented completely.

In some embodiments of the production method, the formation of the one or more fixed connections comprises a formation of at least one fixed electrical connection between two of the circuit substrates. The formation of this at least one electrical connection between mutually corresponding electrical contacts, which are overlapping because of the arrangement of the circuit substrates, on the overlapping circuit substrates is effected by means of an electrically conductive adhesive with the production of a material-bonded connection between the contacts. In this way, the electrical connection between mutually corresponding circuit substrates can be brought about in an efficient and space-saving manner, in particular avoiding additional conducting elements over and above the adhesive. In addition, the use of the adhesive has the advantage that it can initially be applied in the form of a liquid or paste during the production of the contact, and curing for conversion into a solid phase is effected only after a delay. Compared with other methods for producing contact, undesired mechanical damage to the contact surfaces can thus also in particular be prevented during the production of the contact.

In some embodiments of the production method, the formation of the one or more fixed connections comprises the formation of at least one fixed mechanical connection between two of the circuit substrates. In addition, the formation of the at least one mechanical connection is effected by means of a material-bonded connection, which itself does not produce an electrically conducting connection between electrical contacts on the circuit substrates connected in the process. In this way, the mechanical connections can be implemented separately from the electrical connections, with the result that each of these connection types can be optimized individually and without the mechanical connections forming undesired current paths. It is thus also possible to provide the mechanical connections at different points from the electrical connections, in particular such that the mechanical connections can largely absorb mechanical stresses of the electrical connections and thus reduce or even prevent them.

In some embodiments of the production method, the formation of at least one of the mechanical and/or electrical connections comprises an active curing of the adhesive used to produce this material-bonded connection, wherein the film is chosen such that it is resistant to the effects acting on it as a result of the active curing. In this way, the curing process for the material-bonded connections can be controlled in a targeted manner, in particular can be significantly accelerated compared with a pure drying, while the film is preserved and also does not form undesired connections, for instance through fusing, with the arrangement of circuit substrates or the transport substrate.

In particular, according to some embodiments building thereon, the curing can comprise a heating and/or a direct or indirect application of a pressing force to the material-bonded connection. Thus, in a simple manner, in particular depending on the adhesive used to form the material-bonded connections to be cured, the curing process can be controlled in a targeted manner. In some of these embodiments, the heating and/or the direct or indirect application of a pressing force to the material-bonded connection can be effected such that it acts on all circuit substrates of the arrangement of circuit substrates. In this way, a plurality, in particular all of the material-bonded connections can be cured simultaneously, whereby the manufacturing efficiency can be increased or optimized.

A third aspect of the invention relates to a device which is arranged to perform the method according to at least one of the previously mentioned aspects of the invention.

Accordingly, the features and advantages explained herein in relation to the transport method and the production method as well as the different embodiments thereof described herein also apply correspondingly to the device according to the third aspect of the invention.

In the following, preferred embodiments of the device are described, which, where this is not explicitly ruled out or technically impossible, can in each case be combined with each other as desired and with the other aspects of the invention described above, and can be used in conjunction with each of the methods.

In some embodiments, the transport substrate comprises a perforated conveyor belt with a first side for arranging the circuit substrates thereon and a second side opposite the first side. In addition, the device comprises one or more negative pressure generation devices, which are arranged such that, during operation, they bring about the negative pressure for fixing the circuit substrates arranged on the first side of the conveyor belt as well as the film at least partially from the second side through the perforation in the conveyor belt. In this way, the action of the negative pressure can be conducted in a targeted manner to the bearing surfaces of the circuit substrates lying on the first side of the carrier substrate, whereby a high level of efficiency can be achieved with respect to the energy expenditure necessary for fixing the circuit substrates on the transport substrate and associated with the generation of the corresponding negative pressure. The possibility, already mentioned above, of an in particular spatially variable configuration of the negative pressure can thus also be achieved in a simple manner, in particular when several negative pressure generation devices are used.

In some embodiments, the transport substrate comprises a conveyor belt which runs between two rollers, at least one of which is driven for moving the conveyor belt. This type of transport is suitable in particular for the largely vibration-free conveying of the arrangement of circuit substrates, in particular before their conversion into a fixed laminate. Reel-to-reel manufactures can also be implemented in this way, in particular when the conveyor belt is also to serve as carrier substrate for the finished laminates after completion of the production method.

In some embodiments, the device is arranged to perform the production method, in particular one or more of its embodiments described herein and it further comprises a final processing device arranged downstream of the laminate production device relative to the direction of movement of the transport substrate, which is configured to undertake a final processing of the produced laminate of circuit substrates and to remove the film therefrom.

In particular, the final processing device can be configured, in the framework of the final processing, to cool the produced laminate of circuit substrates. This can be advantageous above all if the preceding curing is effected by means of heating the arrangement of circuit substrates. With the aid of the active cooling, in particular the process throughput time can be reduced and, in this sense, an efficiency gain can be achieved.

In addition or instead of this, the final processing device can also be arranged, for instance, to carry out quality assurance measures, in particular one or more inspections of the produced laminate made of circuit substrates.

In some embodiments, the device comprises several production lines which each comprise one or more of the transport devices mentioned, which can be operated simultaneously. Through this simultaneous transport and using the same device, in particular the throughput in the transport and correspondingly in the production of the laminates, in particular solar cell laminates, can be increased, in particular multiplied.

BRIEF DESCRIPTION OF THE DRAWINGS

Further advantages, features and possible applications of the present invention result from the following detailed description in conjunction with the figures.

There are shown in.

In the figures, the same reference signs are used throughout for the same or corresponding elements of the invention.

DETAILED DESCRIPTION

Figure 1:
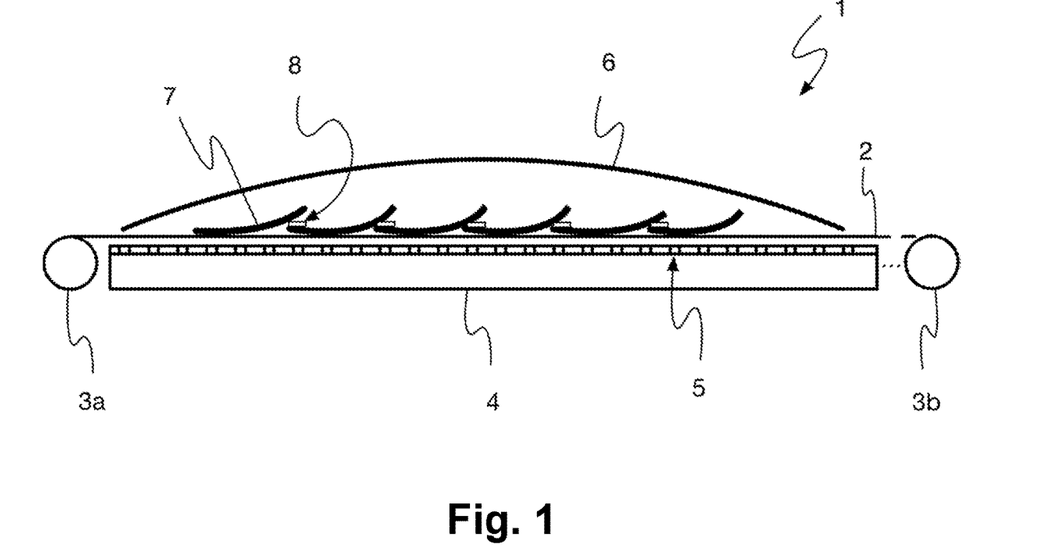
FIG. 1 schematically a transport device according to a preferred embodiment of the invention, on which a regular, not yet fixed arrangement of circuit substrates as well as a film lying loosely over it are arranged.

The transport device 1 represented in FIG. 1 comprises a conveyor belt 2 serving as transport substrate, which runs between two rollers 3a and 3b, and is driven by this pair of rollers. The conveyor belt 2 is permeable to air, for which purpose it can in particular have a perforation and/or be manufactured from porous material. On a first side of the conveyor belt 2, in FIG. 1 this is its upper side, a plurality of circuit substrates 7 is arranged in a regular, shingled structure, with the result that in each case adjacent circuit substrates 7 partially overlap. The overlapping areas serve, in the course of the production method described below, to firmly connect the individual circuit substrates 7 to each other both mechanically and electrically. For this purpose, in the overlapping area the circuit substrates 7 have electrical contact surfaces 8—only some of which are represented here for the sake of clarity—which are each to be brought into connection with corresponding contact surfaces of the respective adjacent circuit substrate 7. An airtight and temperature-resistant film 6 is applied, in particular placed, above the arrangement of the circuit substrates 7, i.e. on the side thereof facing away from the conveyor belt, without forming a fixed connection with the substrates. The film preferably extends over all of the circuit substrates 7 as well as laterally on all sides beyond an envelope curve (i.e. a silhouette of the arrangement in the plane of the transport substrate 2) defined by the arrangement of the circuit substrates 7 on the conveyor belt 2 in the plane defined by the conveyor belt 2.

The transport device 1 additionally comprises one or more negative pressure generation devices 4, which is or are arranged on the side of the conveyor belt 2 opposite the arrangement of circuit substrates (in FIG. 1 this is its underside) and close thereto. The or each of the negative pressure generation devices 4 comprises a plurality of suction openings 5 on its side facing the conveyor belt 2, via which, during operation of the device which is represented in FIG. 2, the negative pressure which can be generated by the negative pressure generation device 4 acts on the conveyor belt 2 and, through the latter, also on the arrangement of the circuit substrates 7 as well as on the film 6.

Figure 2:
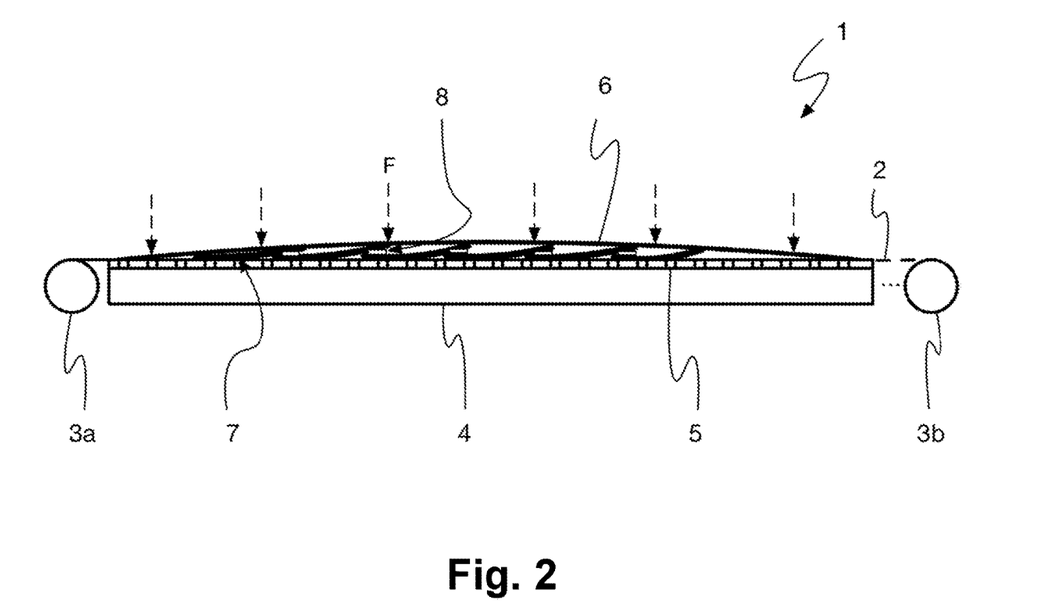
FIG. 2 schematically the same transport device as in FIG. 1, but after activation of the fixing of the arrangement of circuit substrates by means of negative pressure generation.

As can be seen in FIG. 2, during operation of the device 1, fixing of the circuit substrates 7 arranged on the conveyor belt 2 is achieved at least temporarily in that the at least one negative pressure generation device 4 is activated, whereby a negative pressure forms underneath the conveyor belt 2 which, on the one hand pulls the conveyor belt 2 onto the negative pressure generation device 4 and, on the other hand, acts through the conveyor belt 2 on the arrangement of the circuit substrates 7, in order to pull the latter onto the conveyor belt 2 by means of the negative pressure and thus to fix it relative thereto. In addition, the negative pressure also acts on the film 6 in the areas in which the film 6 extends beyond the envelope curve defined by the arrangement of the circuit substrates 7. So far as one or more gaps are present within the envelope curve in the arrangement of the circuit substrates 7, in which the conveyor belt 2 is not covered by one or more of the circuit substrates 7, the negative pressure also acts on the film 6 in these gaps. Where the film 6 is exposed to the negative pressure, a pressing force F brought about by the negative pressure is applied to it in the direction of the first side of the conveyor belt 2, whereby the film 6 is pressed onto the arrangement of the circuit substrates 7 and additionally thus fixes the latter. An additional, for example material-bonded, mechanical connection between the film 6 and the circuit substrates 7 is not necessary for this purpose.

Figure 3:
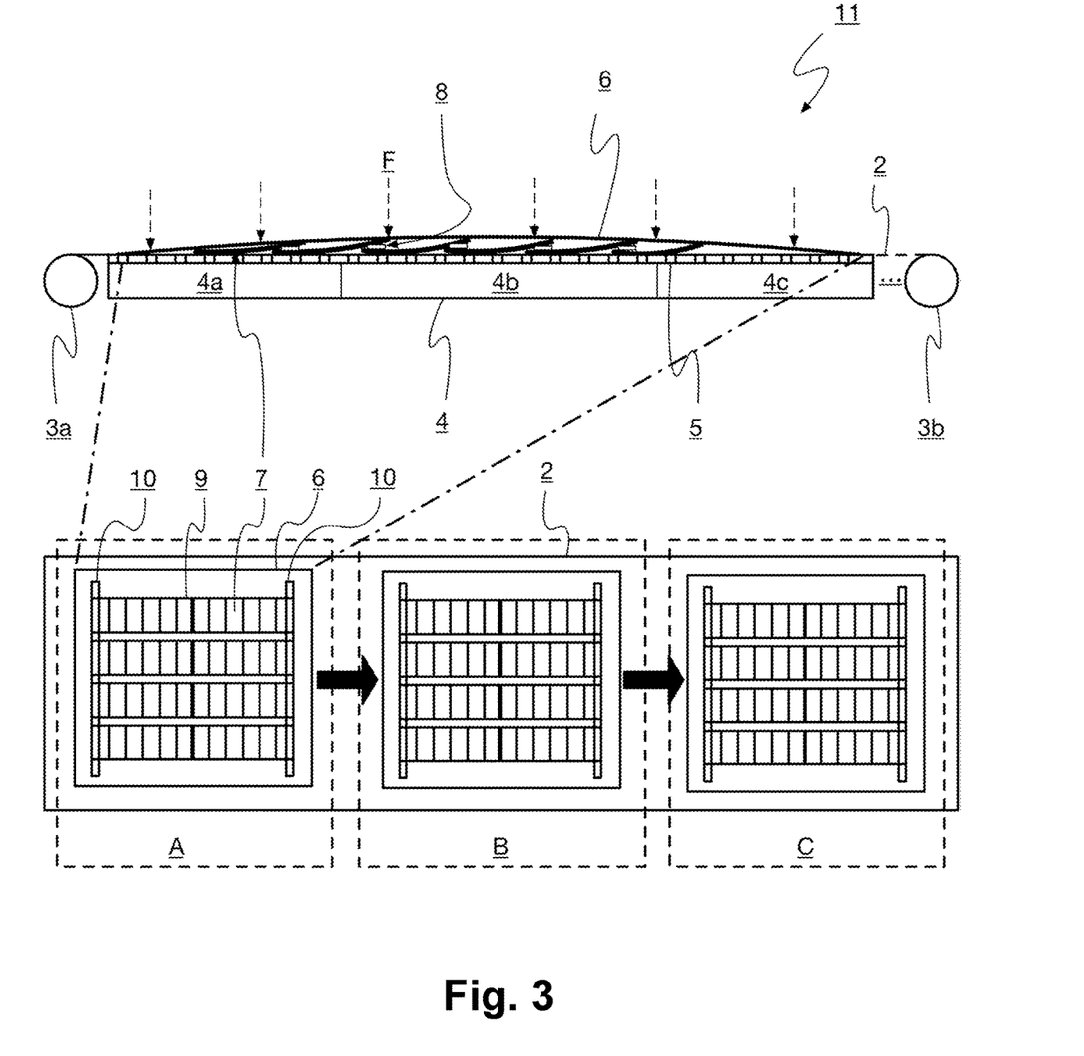
FIG. 3 a combined representation, which schematically shows a device for producing a laminate from flexible circuit substrates, in which the device from FIG. 1 and FIG. 2, which is also shown again, is used as a component of the device.

In FIG. 3, a device 11 for producing a laminate from a plurality of flexible circuit substrates according to a preferred embodiment of the invention is represented, wherein the device 11 includes a transport device 1 according to FIGS. 1 and 2, which is again represented in the upper part of FIG. 3 in a side view.

The lower part of FIG. 3 represents a top view onto the device 11, which comprises three processing devices A to C arranged in series along a production flow, which are connected to each other by the transport device 1 in the sense of a production line. In this top view, the transport device 1 is located underneath the represented device 11, i.e. below the image plane, and is therefore not shown. A first processing device A used along the production flow is a loading device which is arranged to position a desired, in particular shingled arrangement 9 of circuit substrates 7 on the conveyor belt 2. For this, the individual circuit substrates 7 can be placed on the conveyor belt 2 one after the other in series or in any case also in groups at the same time. In the example represented in FIG. 3, the arrangement 9 additionally comprises two connecting elements 10, which serve here as electrical and mechanical connecting elements between four parallel (running horizontally here) rows of circuit substrates 7, in each case arranged in series in the manner of shingles. In particular in the case that the laminate to be formed is a solar module, the connecting elements 10 can be current collectors for conducting away the electrical current generated by the solar module during operation thereof.

As a preparation for the provision of the fixed connection between the individual circuit substrates 7 to be produced in a subsequent process step, the loading device A can in particular be arranged to apply, at suitable points, a connecting means, in particular one or more different adhesives at the points at which adjacent circuit substrates 7 overlap. This can in particular occur such that a first adhesive, which has no electrical conductivity, is applied at those points in an overlapping area of adjacent circuit substrates 7 at which no electrical connection is to be produced. A second, conductive adhesive, is in contrast applied at those points of the overlapping area, in particular on contact surfaces specifically provided for this purpose on at least one of the circuit substrates involved in the connection to be produced, at which an electrically conductive connection is to be produced between the overlapping circuit substrates 7 involved.

The loading device A is additionally arranged, after the actual loading of the conveyor belt 2 with the circuit substrates 7, to apply, in particular place, a film 6 over the thus-produced arrangement 9 made of the circuit substrates 7, with the result that the film 6 ideally projects laterally on all sides beyond the envelope curve defined by the outer boundary of the arrangement 9 in the plane of the conveyor belt 2.

The processing device B, that follows after the loading device along the production flow represented by means of the black arrows, is a laminate production device which serves and is arranged to convert the arrangement 9 made of individual circuit substrates 7, which after the loading is initially still loose, into a fixed laminate. For this, the laminate production device B can in particular be arranged to heat the arrangement 9 made of circuit substrates 7 in order, for instance, to thermally cure the adhesive or adhesives applied during the loading process on the loading device A or also to bring about a connection of the overlapping areas of adjacent circuit substrates 7 in an adhesive-free manner. In some cases, the latter can in particular also be brought about in a form-fitting manner or by fusing the corresponding surfaces involved in the connection.

Alternatively or in addition the laminate production device can also be arranged to bring about the stabilization of the connection, in particular the curing of the adhesives, in another manner, for example by means of irradiation by ultraviolet light or another type of radiation or by exerting a mechanical force on the arrangement 9 or individual points thereof.

Even further downstream along the production flow, the device 11 comprises a final processing device C, which in particular can be arranged to cool the arrangement 9 heated in the laminate production device B and/or to check with regard to possible manufacturing errors and/or malfunctioning. The final processing device C can also be arranged optionally to carry out further necessary manufacturing steps, which can include in particular encapsulation of the laminate formed from the arrangement 9, for instance with a protective layer, such as a protective varnish, or a flexible housing.

The transport device 1 included in the device 11 serves in particular firstly to carry the arrangement 9 during the various manufacturing steps and to hold it in position, and secondly to transport the arrangement 9 between the individual manufacturing sites to the next processing station in each case, wherein the arrangement 9 is fixed in each case as described above. The transport device 1 belonging to the device 11 serves in particular firstly to support the arrangement 9 during the various manufacturing steps and to hold it in position, and secondly to transport the arrangement 9 between the individual manufacturing sites to the next processing station in each case, wherein the arrangement 9 is fixed in each case as described above. For this purpose, the negative pressure generation device 4 of the transport device 1 can in particular also be divided into individual segments 4a to 4c and/or comprise different separate negative pressure generation devices 4a to 4c, with the result that the negative pressure generated by the individual segments or negative pressure generation devices 4a to 4c can be chosen differently or variably from segment to segment or from negative pressure generation device to negative pressure generation device, preferably in a reconfigurable manner. In particular, the transport device 1 can be arranged or configurable such that, at those points along the production flow at which there is an increased risk of an undesired disturbance of the arrangement 9 of the circuit substrates 7 on the conveyor belt 2 occurring, for instance through vibrations or acceleration, a negative pressure is generated that is increased compared with other points. In contrast, at other points, at which no or few mechanical effects on the arrangement 9 are to be expected, the negative pressure can however possibly be reduced, in order to save energy for instance.

Figure 4:
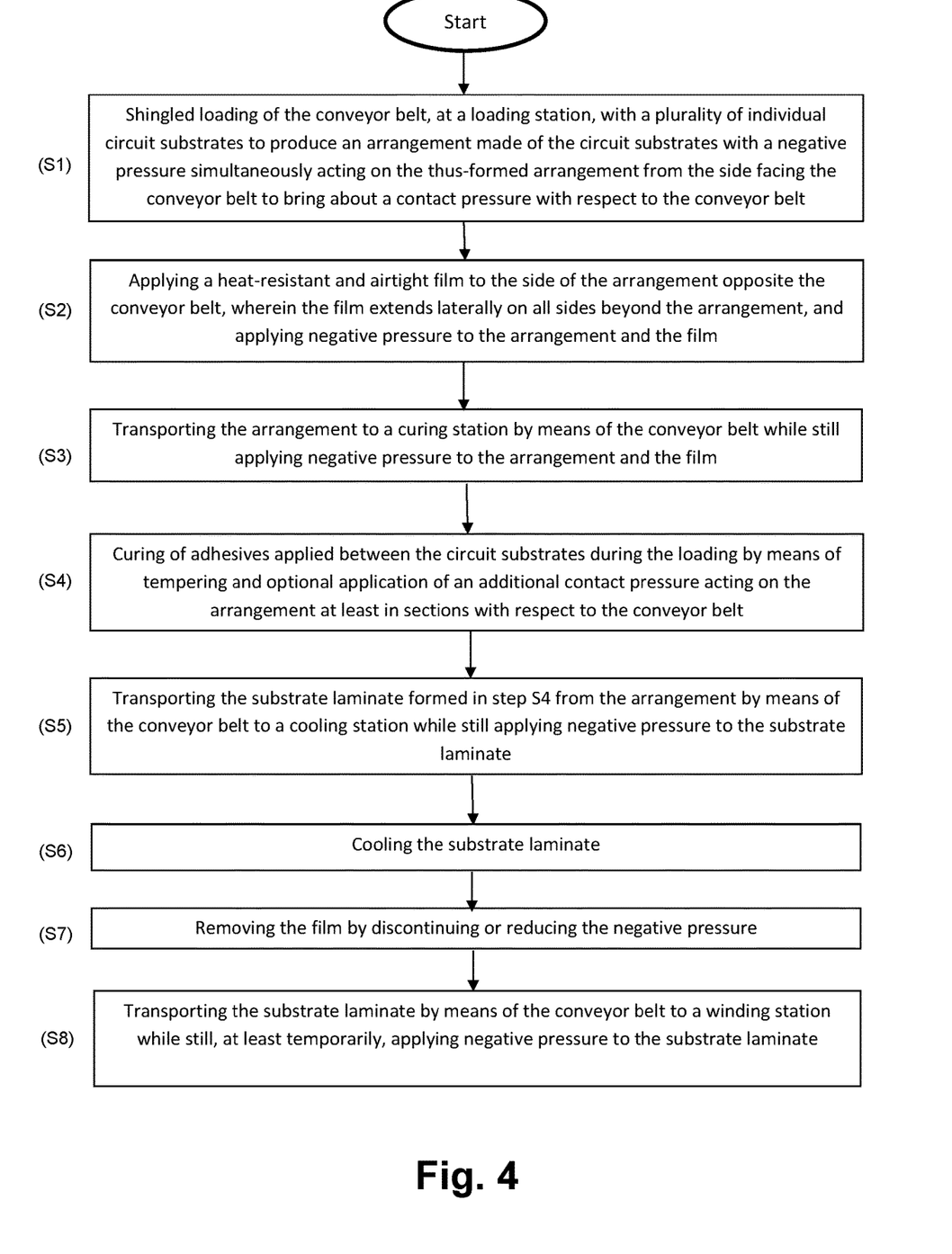
FIG. 4 a flow diagram to illustrate a preferred embodiment of the production method according to the invention for a laminate made of a plurality of circuit substrates, wherein the production method also comprises the transport method according to the invention.

In FIG. 4, a flow diagram to illustrate a preferred embodiment of the method according to the invention for producing a laminate from a plurality of circuit substrates is represented, which also comprises the transport method according to the invention. The method can optionally be performed in particular using the device 11 described in FIG. 3, and is therefore also described more precisely in the following with reference thereto.

The method begins with a step S1, which is carried out at the loading device or loading station A of the device 11 from FIG. 3. Here, a shingle-like loading of the conveyor belt 2 is effected with a plurality of individual circuit substrates 7, as well as optionally with further elements, such as the connecting elements 10. Through the loading, an initially still loose arrangement 9 of circuit substrates is produced, which represents a precursor of the laminate made of circuit substrates to be manufactured. For this purpose, the individual circuit substrates 7, as already described above with reference to FIG. 3, are arranged on the conveyor belt 2, and in the overlapping areas of adjacent circuit substrates 7, in each case at least one adhesive is applied at suitable points for the material-bonded connection of the circuit substrates 7. In particular, to produce conducting connections between mutually corresponding contact points of the circuit substrates 7 to be connected to each other, the adhesive can have a suitable high electrical conductivity. During this loading process, or alternatively also only after it, the arrangement 9 produced during the loading is fixed by applying negative pressure, which is generated by the negative pressure generation device 4 and acts on the arrangement 9 through the conveyor belt 2, in particular the suction openings 5 thereof.

In any event after, optionally also already in the course of the completion of the arrangement 9, in a step 2, a heat-resistant and airtight film 6 is additionally applied to, in particular placed on, the formed arrangement 9 on the side of the arrangement 9 opposite the conveyor belt 2. In the meantime, the negative pressure can be reduced or even switched off. Ideally, the film 6 is applied to the arrangement 9 such that—as represented at the bottom in FIG. 3—it extends laterally on all sides beyond the arrangement 9. When the film 6 is applied, the negative pressure is used in order to fix the arrangement 9 both directly through suction of the arrangement 9 in the direction of the conveyor belt 2 and also indirectly through suction of the film 6, which is located above the arrangement 9 and thus exerts a pressing force F on the arrangement 9.

Then, in a step S3, the arrangement 9 is transported, by means of a translational movement of the conveyor belt 2 brought about by driving at least one of the rollers 3a, 3b, to the laminate production device B, which can be constructed in particular as curing station for the adhesives used during the loading. The transport is effected while still applying negative pressure to the arrangement 9 and the film 6.

In a further step S4, in the laminate production device B a curing is effected of the adhesives applied during the loading, by means of tempering and optionally also by applying an additional contact pressure acting on the arrangement 9, at least in sections, with respect to the conveyor belt 2. The additional contact pressure can, for example, be exerted by means of a corresponding pressing element, in particular a die, which acts on the film 6 and thus also indirectly on the arrangement 9. In particular, the pressing element can also be arranged and at the same time used to also supply all or some of the heat used for the tempering. The tempering used in the curing can, depending on the material used, in particular the circuit substrates 7, the film 6 and optionally the adhesives, be effected in particular at temperatures between 150° C. and 250° C., e.g. at approximately 190° C. Accordingly, the film 6 must be sufficiently heat-resistant to these temperatures. If, as mentioned, a contact pressure is also exerted on the film via a pressing element, this film must also be resistant to this contact pressure. The same applies with respect to any type of measure impinging on the film 6 during the transport process or the production process.

After a fixed substrate laminate made of the circuit substrates 7 and optionally further elements, such as the connecting elements 10, has been produced in the laminate production device B, in step S5 a further transport of the substrate laminate formed is effected by means of the conveyor belt 2 to the final processing device C, which can be constructed in particular as cooling device. There, in step S6, cooling of the substrate laminate heated during the curing is effected.

After the production of the substrate laminate is finished in this way, in a further step S7, the film 6 can be removed from the substrate laminate by discontinuing or reducing the negative pressure, and optionally reused for a further substrate laminate in a new manufacturing run.

Finally, in a concluding step S8, the substrate laminate can be transported by means of the conveyor belt 2 to a winding station, while still applying negative pressure to the substrate laminate at least temporarily, and wound up there. The winding station can in particular coincide with the roller 3b from FIG. 3. The latter is possible in particular when the conveyor belt 2 is also to be used as carrier substrate for the substrate laminate after the production process has ended.

While at least one exemplary embodiment has been described above, it is to be noted that a large number of variations for this exists. It is also to be noted that the described exemplary embodiments only represent non-limiting examples, and it is not intended thereby to limit the scope, the applicability or the configuration of the devices and methods described here. Rather, the above description will provide a person skilled in the art with guidance on implementing at least one exemplary embodiment, wherein it is understood that various amendments to the functioning and the arrangement of the elements described in an exemplary embodiment can be made without deviating from the subject-matter specified in each case in the appended claims as well as its legal equivalents.

1 transport device
2 transport substrate, in particular conveyor belt
3a, 3b rollers for conveyor belt
4, 4a-c negative pressure generation device(s)
5 suction openings of the negative pressure generation device
6 film
7 circuit substrate
8 electrical contact surface on circuit substrate
9 arrangement of circuit substrates
10 connecting element
11 device for the production of a laminate from flexible circuit substrates
A loading device
B laminate production device
C final processing device
F pressing force brought about by negative pressure and acting on the film

The invention claimed is:

1. A method for transporting an arrangement of flexible circuit substrates positioned on a first side of a transport substrate, in particular an arrangement of flexible solar cells, during the production of a laminate from the arranged circuit substrates, in particular between two processing steps in the production of the laminate, wherein the method comprises:
    applying a film to the arranged circuit substrates on the side thereof opposite the transport substrate, with the result that the film comes to lie over the transport substrate in at least two sections that are separate from each other and are not covered by a circuit substrate, and runs between these continuously over at least one of the circuit substrates;
    fixing (S2, S3) the arranged circuit substrates on the transport substrate by means of the generation of a negative pressure acting on the arrangement of the circuit substrates, and which, at least in sections, directly impinges on the arrangement of the circuit substrates itself, as well as, at least in sections, additionally on the film (6) and thereby in turn indirectly on at least one of the circuit substrates in the direction of the transport substrate with a pressing force with respect to the transport substrate; and transporting the arrangement of circuit substrates fixed on the transport substrate by means of the pressing force by moving the transport substrate.

2. A method for producing a laminate of flexible circuit substrates, in particular a laminate of flexible solar cells, wherein the method comprises:

arranging a plurality of flexible circuit substrates to be converted into a joint laminate on a transport substrate by means of a loading device with the result that each of the circuit substrates overlaps with at least one further circuit substrate to form a connection;

transporting the arrangement made of circuit substrates from the loading device (to a laminate production device, wherein the arrangement is transported at least in sections by means of the transport substrate utilizing the method according to claim 1;

forming one or more fixed connections between at least two of the circuit substrates fixed on the transport substrate by means of the laminate production device to form a laminate formed from these circuit substrates.

3. The method according to claim 1, wherein the film is applied to the arranged circuit substrates such that, in at least one section, it projects laterally beyond an outer envelope curve of the arrangement of the circuit substrates with respect to a direction running parallel to the first side of the transport substrate and is acted on there with a pressing force with respect to the transport substrate by means of the negative pressure.

4. The method according to claim 1, wherein the flexible circuit substrates are arranged on the transport substrate in a regular shingled structure before the application of the film.

5. The method according to claim 1, wherein, before the application of the film, the flexible circuit substrates are arranged on the transport substrate such that, between at least two of the arranged circuit substrates, a gap forms which is not covered by another of the circuit substrates and which lies completely within the outer envelope curve of the arrangement of the circuit substrates with respect to a direction running parallel to the first side of the transport substrate.

6. The method according to claim 1, wherein the arrangement of the flexible circuit substrates on the transport substrate before the application of the film further comprises an introduction of at least one connecting element provided in addition to the circuit substrates for producing a mechanical and/or electrical connection between at least two of the arranged circuit substrates.

7. The method according to claim 1, further comprising a temporal or spatial variation of the negative pressure along the direction of movement of the transport substrate for producing a correspondingly spatially and/or temporally variable pressing force acting on the arrangement of the circuit substrates with respect to the transport substrate.

8. The method according to claim 2, further comprising: removing the film from the arranged circuit substrates after or during the formation of at least one of the one or more fixed connections.

9. The method according to claim 8, wherein the method is carried out repeatedly and the film removed from the arranged circuit substrates in a previous iteration of the method is reused according to the method in a subsequent iteration of the method as film for fixing the circuit substrates.

10. The method according to claim 2, wherein:

the formation of the one or more fixed connections comprises a formation of at least one fixed electrical connection between two of the circuit substrates; and the formation of this at least one electrical connection between mutually corresponding electrical contacts, which are overlapping because of the arrangement of the circuit substrates, is effected on the overlapping circuit substrates by means of an electrically conductive adhesive with the production of a material-bonded connection between the contacts.

11. The method according to claim 2, wherein:

the formation of the one or more fixed connections comprises a formation of at least one fixed mechanical connection between two of the circuit substrates; and the formation of the at least one mechanical connection is effected by means of a material-bonded connection, which itself does not produce an electrically conducting connection between electrical contacts on the circuit substrates connected in the process.

12. The method according to claim 10, wherein the formation of at least one of the mechanical and/or of the electrical connections comprises an active curing of the adhesive used to produce this material-bonded connection, wherein the film is chosen such that it is resistant to the effects acting on it as a result of the active curing.

13. The method according to claim 12, wherein the curing comprises a heating and/or a direct or indirect application of a pressing force to the material-bonded connection.

14. The method according to claim 13, wherein the heating and/or the direct or indirect application of a pressing force to the material-bonded connection acts on all circuit substrates of the arrangement of circuit substrates.

15. A device, which is arranged to perform the method according to claim 1.

16. The device according to claim 15 wherein:

the transport substrate comprises a perforated conveyor belt with a first side for arranging the circuit substrates thereon and a second side opposite the first side; and the device comprises one or more negative pressure generation devices, which are arranged such that, during operation, they bring about the negative pressure for fixing the circuit substrates arranged on the first side of the conveyor belt as well as the film at least partially from the second side through the perforation in the conveyor belt.

17. The device according to claim 15, wherein the transport substrate comprises a conveyor belt, which runs between two rollers, at least one of which is driven for moving the conveyor belt.

18. The device of claim 15, further comprising: a final processing device arranged downstream of the laminate production device, with respect to the direction of movement of the transport substrate, which is configured to undertake a final processing of the produced laminate of circuit substrates and to remove the film therefrom.

19. The device according to claim 18, wherein the final processing device is configured, in the framework of the final processing, to cool the produced laminate of circuit substrates.

* * * * *